US006908862B2

(12) United States Patent
Li et al.

(10) Patent No.: US 6,908,862 B2
(45) Date of Patent: Jun. 21, 2005

(54) HDP-CVD DEP/ETCH/DEP PROCESS FOR IMPROVED DEPOSITION INTO HIGH ASPECT RATIO FEATURES

(75) Inventors: Dongqing Li, Santa Clara, CA (US); Xiaolin C. Chen, San Jose, CA (US); Lin Zhang, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 187 days.

(21) Appl. No.: 10/138,189

(22) Filed: May 3, 2002

(65) Prior Publication Data

US 2003/0207580 A1 Nov. 6, 2003

(51) Int. Cl.⁷ ............................................. H01L 21/311
(52) U.S. Cl. ...................... 438/700; 438/666; 438/667; 438/668; 438/672; 438/673; 438/978; 216/39
(58) Field of Search ................................. 438/666, 667, 438/672, 673, 668, 978, 700

(56) References Cited

U.S. PATENT DOCUMENTS

| | | |
|---|---|---|
| 4,690,746 A | 9/1987 | McInerney et al. |
| 4,872,947 A | 10/1989 | Wang et al. |
| 4,892,753 A | 1/1990 | Wang et al. |
| 4,960,488 A | 10/1990 | Law et al. |
| 5,000,113 A | 3/1991 | Wang et al. |
| 5,089,442 A | 2/1992 | Olmer |
| 5,156,881 A | 10/1992 | Okano et al. |
| 5,271,972 A | 12/1993 | Kwok et al. |
| 5,275,977 A | 1/1994 | Otsubo et al. |
| 5,279,865 A | 1/1994 | Chebi et al. |
| 5,302,233 A | 4/1994 | Kim et al. |
| 5,319,247 A | 6/1994 | Matsuura |
| 5,362,526 A | 11/1994 | Wang et al. |
| 5,416,048 A | 5/1995 | Blalock et al. |
| 5,468,342 A | 11/1995 | Nulty et al. |
| 5,571,576 A | 11/1996 | Qian et al. |
| 5,599,740 A | 2/1997 | Jang et al. |
| 5,624,582 A | 4/1997 | Cain |
| 5,679,606 A | 10/1997 | Wang et al. |

(Continued)

FOREIGN PATENT DOCUMENTS

| | | |
|---|---|---|
| JP | 2-58836 A | 2/1990 |
| JP | 7-161703 A | 6/1995 |

OTHER PUBLICATIONS

U.S. Appl. No. 09/854,083, Tan et al., filed May 11, 2001.
U.S. Appl. No. 09/400,338, Xia et al., filed Sep. 21, 1999.
Abraham, "Reactive Facet Tapering of Plasma Oxide For Multilevel Interconnect Applications," VMIC Conference. pp. 115–121 (1987).
Lee et al., "Dielectric Planarization Techniques For Narrow Pitch Multilevel Interconnects," VMIC Conference, pp. 85–92 (1987).

(Continued)

*Primary Examiner*—David Nelms
*Assistant Examiner*—Renee R. Berry
(74) *Attorney, Agent, or Firm*—Townsend & Townsend & Crew

(57) ABSTRACT

A method of depositing a film on a substrate disposed in a substrate processing chamber. The method includes depositing a first portion of the film by forming a high density plasma from a first gaseous mixture flown into the process chamber. The deposition processes is then stopped and part of the deposited first portion of the film is etched by flowing a halogen etchant into the processing chamber. Next, the surface of the etched film is passivated by flowing a passivation gas into the processing chamber, and then a second portion of the film is deposited over the first portion by forming a high density plasma from a second gaseous mixture flown into the process chamber. In one embodiment the passivation gas consists of an oxygen source with our without an inert gas.

23 Claims, 6 Drawing Sheets

U.S. PATENT DOCUMENTS

| | | |
|---|---|---|
| 5,719,085 A | 2/1998 | Moon et al. |
| 5,850,105 A | 12/1998 | Dawson et al. |
| 5,858,876 A | 1/1999 | Chew |
| 5,872,052 A | 2/1999 | Iyer |
| 5,872,058 A | 2/1999 | Van Cleemput et al. |
| 5,913,140 A | 6/1999 | Roche et al. |
| 5,915,190 A | 6/1999 | Pirkle |
| 5,937,323 A | 8/1999 | Orczyk et al. |
| 5,953,635 A | 9/1999 | Andideh |
| 5,968,610 A | 10/1999 | Liu et al. |
| 5,990,000 A | 11/1999 | Hong et al. |
| 6,030,881 A | 2/2000 | Papasouliotis et al. |
| 6,037,018 A | 3/2000 | Jang et al. |
| 6,039,851 A | 3/2000 | Iyer |
| 6,059,643 A | 5/2000 | Hu et al. |
| 6,087,278 A * | 7/2000 | Kim et al. .................. 438/978 |
| 6,136,685 A | 10/2000 | Narwanker et al. |
| 6,167,834 B1 | 1/2001 | Wang et al. |
| 6,170,428 B1 | 1/2001 | Redeker et al. |
| 6,182,602 B1 | 2/2001 | Redeker et al. |
| 6,189,483 B1 | 2/2001 | Ishikawa et al. |
| 6,191,026 B1 | 2/2001 | Rana et al. |
| 6,194,038 B1 | 2/2001 | Rossman |
| 6,197,705 B1 | 3/2001 | Vassiliev |
| 6,203,863 B1 | 3/2001 | Liu et al. |
| 6,335,288 B1 | 1/2002 | Kwan et al. |
| 6,395,150 B1 | 5/2002 | Van Cleemput et al. |
| 6,596,654 B1 | 7/2003 | Bayman et al. |
| 6,602,434 B1 * | 8/2003 | Hung et al. .................. 216/39 |

OTHER PUBLICATIONS

Musaka, "Single Step Gap Filling Technology fo Subhalf Micron Metal Spacings on Plasma Enhanced *TEOS/O2 Chemical Vapor Deposition System*," International Conference on Solid State Devices and Materials pp. 510–512, held in Japan, (1993).

Qian et al., "High Density Plasma Deposition and Deep Submicron Gap Fill with Low Dielectric Constant SiOF Films," DUMIC Conference, pp. 50–56, held in California (1995).

Vassilieuv et al., "Trends in void–free pre–metal CVD dielectrics," *Solid State Technology*, pp. 129–136 (2001).

Meeks et al., "Modeling of $SiO_2$ deposition in high density plasma reactors and comparisons of model predictions with experimental measurements," *J. Vac. Sci. Technol. A*, 16(2):544–563 (1998).

* cited by examiner

HDP-CVD DEP/ETCH/DEP PROCESS FOR IMPROVED DEPOSITION INTO HIGH ASPECT RATIO FEATURES

BACKGROUND OF THE INVENTION

One of the primary steps in the fabrication of modern semiconductor devices is the formation of a thin film on a semiconductor substrate by chemical reaction of gases. Such a deposition process is referred to as chemical vapor deposition ("CVD"). Conventional thermal CVD processes supply reactive gases to the substrate surface where heat-induced chemical reactions take place to produce a desired film. Plasma-enhanced CVD ("PECVD") techniques, on the other hand, promote excitation and/or dissociation of the reactant gases by the application of radio-frequency ("RF") energy to a reaction zone near the substrate surface, thereby creating a plasma. The high reactivity of the species in the plasma reduces the energy required for a chemical reaction to take place, and thus lowers the temperature required for such CVD processes as compared to conventional thermal CVD processes. These advantages are further exploited by high-density-plasma ("HDP") CVD techniques, in which a dense plasma is formed at low vacuum pressures so that the plasma species are even more reactive.

Any of these CVD techniques may used to deposit conductive or insulative films during the fabrication of integrated circuits. For applications such as the deposition of insulation films as premetal or intermetal dielectric layers in an integrated circuit or for shallow trench isolation, one important physical property of the CVD film is its ability to completely fill gaps between adjacent structures without leaving voids within the gap. This property is referred to as the film's gapfill capability. Gaps that may require filling include spaces between adjacent raised structures such as transistor gates, conductive lines, etched trenches or the like.

As semiconductor device geometries have decreased in size over the years, the ratio of the height of such gaps to their width, the so-called "aspect ratio," has dramatically increased. Gaps having a combination of a high aspect ratio and a small width present a challenge for semiconductor manufacturers to fill completely. In short, the challenge usually is to prevent the deposited film from growing in a manner that closes off the gap before it is filled. Failure to fill the gap completely results in the formation of voids in the deposited layer, which may adversely affect device operation, for example by trapping undesirable impurities.

One process that the semiconductor industry has developed to improve gapfill capability of insulation films uses a multistep deposition and etching process. Such a process is often referred to as a deposition/etch/deposition ("dep/etch/dep") process. Such dep/etch/dep processes divide the deposition of the gapfill layer into two or more steps separated by a plasma etch step. The plasma etch step etches the upper corners of the first deposited film more than the film portion deposited on the sidewall and lower portion of the gap, thereby widening the gap and enabling the subsequent deposition step to fill the gap without prematurely closing it off. Typically, dep/etch/dep processes can be used to fill higher-aspect-ratio small-width gaps than a standard deposition step for the particular chemistry would allow.

Most of the early dep/etch/dep processes known to the inventors were limited to thermal CVD and PECVD processes. HDP-CVD processes generally have superior gapfill capabilities as compared to these other types of CVD processes because HDP-CVD deposition process provide for a sputtering component to the deposition process simultaneous with film growth. For this reason, HDP-CVD techniques are sometimes referred to as simultaneous dep/etch processes.

It has been found in practice, however, that while HDP-CVD processes generally have better gapfill capabilities than similar non-HDP-CVD processes, for certain gap widths there remains a limit to the aspect ratio of gaps that can be filled. Accordingly, a number of different dep/etch/dep techniques have been specifically developed for HDP-CVD processes.

One example of a previously known HDP-CVD dep/etch/dep technique is described in U.S. Pat. No. 6,030,881 ("the '881 patent") issued jointly to Novellus and International Business Machines. The '881 patent describes an in situ HDP-CVD dep/etch/dep process performed in a single chamber. The described process transitions from deposition to etch steps by changing the gas mixture composition along with other chamber parameters.

While the '881 patent does not include details of a specific HDP-CVD dep/etch/dep process recipe, it does include several tables that identify possible ranges for various parameters in each of the deposition and etch steps of the process. The first two tables provided, Tables 1 and 2, recite the possible gas flow rates of the various gases introduced in the deposition and etch steps, respectively. According to Table 1, the deposition step flows silane, oxygen and an inert gas into the chamber at rates similar to many previously known HDP-CVD deposition processes. Table 2 then indicates that the etch step flows at least oxygen and an inert gas into the chamber along with maybe flows of either or both a reactive etch gas and silane.

Based on the parameters set forth in Table 2, it can be understood that the dep/etch/dep process disclosed in the '881 patent has a number of limitations. For example, one possible use for an HDP-CVD dep/etch/dep step in the fabrication of current and future integrated circuits is for shallow trench isolation (STI) applications. Such STI applications often provide the most challenging gapfill requirements for insulation layers especially considering that many integrated circuits now use copper and appropriate dual damascene techniques as the interconnect structure. According to Table 2, however, the '881 patent contemplates performing the etch step without any reactive etch gas (i.e., a reactive etch gas flow rate of 0 sccm). Such an etch step is a fully directional etch (i.e., an anisotropic sputter etch) that is susceptible to corner clipping problems.

Assuming a reactive etch gas (i.e., a fluorine-containing gas according to the examples listed in the patent) is used, however, Table 2 provides two possible scenarios for its use. In the first scenario, the reactive etch gas is introduced into the chamber with flows of oxygen and an inert gas (i.e., the flow of silane is 0 sccm). The inventors of the present patent have determined that transitioning from such a fluorine-containing etch step straight to a subsequent deposition step as taught in the '881 patent results in an undesirable amount of fluorine being incorporated at the interface of the first and second layers of the film and may also result in etch defects (silicon-rich pockets on the surface of the etched film that look like particles). In the second scenario, where both a reactive etch gas and silane are introduced into the HDP chamber along with flows of oxygen and an inert gas, a small amount of film deposition will occur simultaneous with the etch process thereby incorporating additional fluorine into the film.

Regardless of how such fluorine is incorporated in the film, the result is generally undesirable. In some situations the incorporated fluorine may outgas during subsequent processing steps. In other situations, the existence of fluorine in the layer may make a semiconductor manufacturer wary of the integrity of the layer.

Accordingly, while HDP-CVD dep/etch/dep processes may provide gapfill improvements over standard HDP-CVD processes, further improvements and/or alternative approaches are desirable. Such improved processes are particularly desirable in light of the aggressive gapfill challenges presented by integrated circuit designs employing minimum feature sizes of 0.10 microns and less.

BRIEF SUMMARY OF THE INVENTION

Embodiments of the present invention pertain to an in situ HDP-CVD dep/etch/dep process that overcomes the problems of previously known processes. Embodiments of the invention provide higher throughput than ex situ dep/etch/dep processes and have superior gapfill capabilities as compared to similar non-dep/etch/dep HDP-CVD processes.

One embodiment of the invention provides a method of depositing a film on a substrate disposed in a substrate processing chamber. The method includes depositing a first portion of the film from a high density plasma formed from a first gaseous mixture flown into the process chamber. Next, the deposition process is stopped and part of the deposited film is etched with a halogen etchant. After the etch step, a passivation gas is flowed into the processing chamber to passivate the surface of the etched film and then a second portion of the film is deposited over the first portion by forming a high density plasma from a second gaseous mixture flown into the process chamber.

In one embodiment the passivating step comprises exposing the surface of the etched film to an oxygen-containing plasma and in some embodiments further comprises biasing the plasma toward the substrate.

Another embodiment of the method of the present invention deposits a silica glass film on a substrate disposed in a substrate processing chamber by forming a high density plasma within the substrate processing chamber to heat the substrate to a temperature of at least 400° C. prior to depositing the silica glass film on the substrate. The high density plasma is then maintained while, in order, (i) a first process gas comprising a silicon source and an oxygen source is flowed into the processing chamber to deposit a first portion of the silica glass film over the substrate, (ii) a fluorine etchant is flowed into the process chamber to etch part of the first portion of the silica glass film; (iii) a passivation gas comprising oxygen is flowed into the processing chamber and (iv) a second process gas comprising silane and oxygen is flowed into the processing chamber to deposit a second portion of the silica glass film over the first portion. In some embodiments, RF bias power is applied to the plasma during deposition of the first portion of the film, stopped prior to etching the part of the first portion of the film and then again applied prior to deposition of the second portion of the film.

These and other embodiments of the invention along with many of its advantages and features are described in more detail in conjunction with the text below and attached figures.

DETAILED DESCRIPTION OF THE INVENTION

Embodiments of the invention pertain to a multistep high density plasma process for depositing dielectric material into high aspect ratio features. Embodiments of the invention permit the dielectric material to be deposited with substantially 100% gapfill at increased aspect ratios as compared to similar non-dep/etch/dep processes. For example, for gaps having a width of 0.13 microns substantially 100% gapfill is can be achieved by embodiments of the invention for aspect ratios as large as 6:1. Embodiments of the invention are useful for a variety of different applications and are particularly useful for the fabrication of integrated circuits having minimum feature sizes of 0.13 microns or less.

In some embodiments of the invention, the dep/etch/dep process is performed as a continuous process without the need for separate plasma generation in each of the individual phases. The continuity of such a process results in increased process uniformity across a wafer. In particular, such continuity results in the same gas distribution for the deposition gases and for the etchant gas during their respective phases. Thus, even if this distribution includes some degree of nonuniformity, the multiple phases of the process tend to compensate. In regions of a wafer where the deposition is greater than average, the degree of etching tends to similarly be greater than average. Conversely, in regions of a wafer where the deposition is less than average, the degree of etching tends to similarly be less than average.

Figure 1:
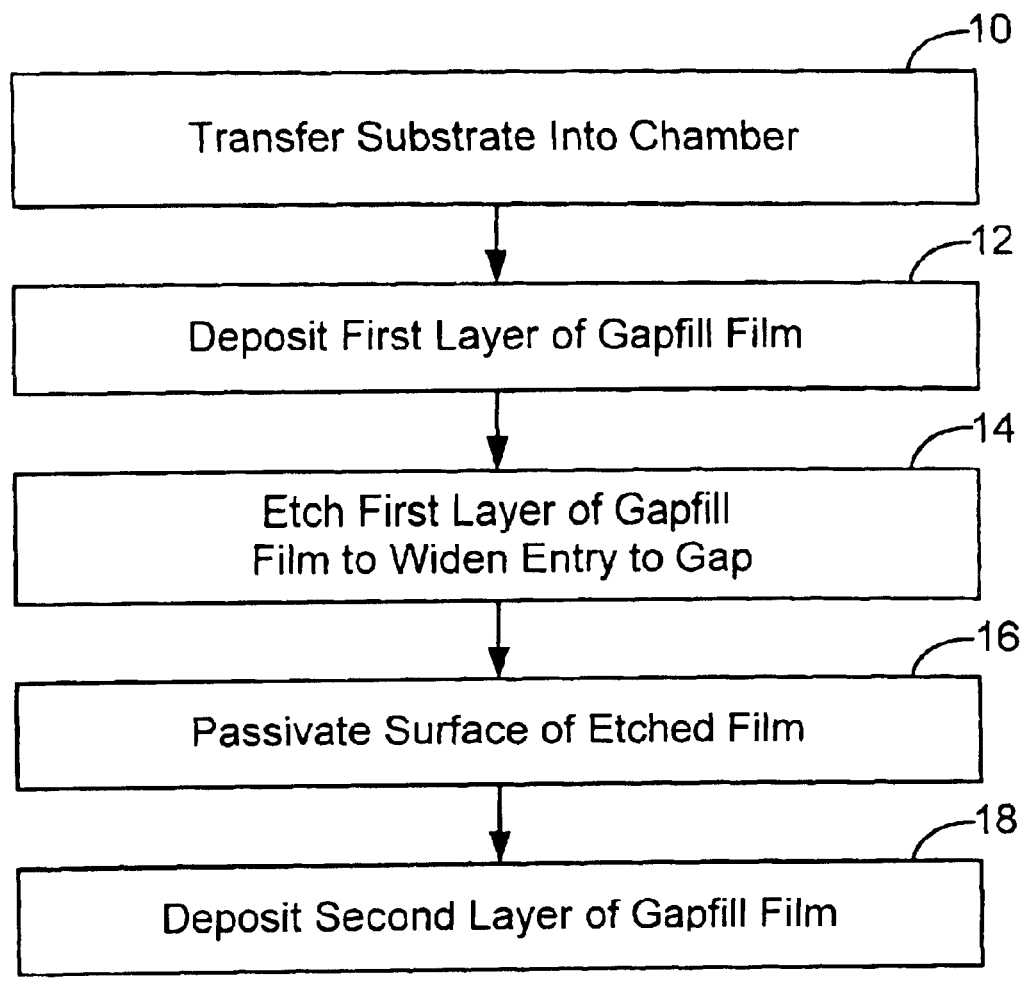
FIG. 1 is a flowchart depicting the steps associated with one embodiment of the present invention.

In order to better appreciate and understand the present invention, reference is made to FIG. 1, which is a flowchart depicting the steps associated with one embodiment of the invention, and FIGS. 2A–2D, which are simplified cross-sectional views of a substrate that illustrate the profile of film growth as the substrate is processed according to the steps depicted in FIG. 1. The process discussed below with respect to FIGS. 1 and 2A–2D is for an undoped silica glass (USG) film that may be used, for example, in a shallow trench isolation (STI) application. It is to be understood, however, that the techniques of the present invention are applicable to other applications such as intermetal dielectric (IMD) layers and premetal dielectric (PMD) among others. Also, the techniques of the present invention are applicable to the deposition of a variety of materials using HDP-CVD techniques. These materials, the use of which is application dependent, include doped silica glass films, such as phosphorous silica glass (PSG), boron-doped silicate glass (BSG), borophosphosilicate glass (BPGS) and carbon-doped silica glass (SiOC); silicon nitride; silicon oxynitride; silicon carbon materials (SiC) and others.

Figure 2A:
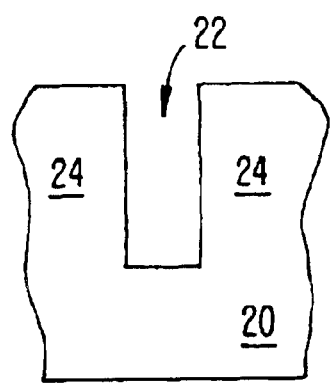
FIGS. 2A–2D are simplified cross-sectional views of a substrate that illustrate the profile of film growth as the substrate is processed according to the steps depicted in FIG. 1.

As shown in FIG. 1, the process starts by loading a substrate 20 into a substrate processing chamber (step 10). Referring to FIG. 2A, substrate 20 has one or more gaps 22 formed between features 24. Features 24 may be, for example, adjacent metal lines, transistor gates or other features. In FIGS. 2A–2D, however, features 24 represent areas of the substrate 20 between etched trenches that are shown as gaps 22.

Figure 2B:
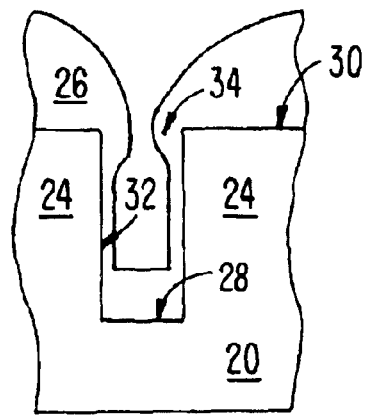

Once the substrate is properly positioned, a high density plasma is formed from a deposition gas to deposit a first layer of silica glass on the substrate (FIG., 1, step 12). The deposition gas includes a silicon source, such as monosilane ($SiH_4$), an oxygen source, such as molecular oxygen ($O_2$), and optionally an inert gas, such as helium (He) or argon (Ar). Referring to FIG. 2B, deposition of this first layer 26 results in a partial filling of gap 22. The profile of layer 26 within and outside of the gap will depend on the parameters used during deposition step 12 as well as the length of time of step 12.

Generally, conventional silica glass HDP-CVD deposition techniques result in direct silicon oxide deposition on the horizontal surfaces of the substrate, such as surface 28 within gap 22 and surfaces 30 above features 24. The deposition process also results in indirect deposition (often referred to as re-deposition) of silicon oxide on sidewalls 32 due to the recombination of material sputtered from the silicon oxide film as it grows. In certain small-width, high-aspect-ratio applications where the techniques of the present invention are most beneficial, the continued growth of the silicon oxide film results in formations 34 on the upper section gap sidewall that grow toward each other at a rate of growth exceeding the rate at which the film grows laterally on lower portions of the sidewall as shown in FIG. 2B. If deposition step 12 continues long enough, the final result of this process is a void that forms within the gap when the two portions 34 of the upper sidewall contact each other.

Figure 2C:
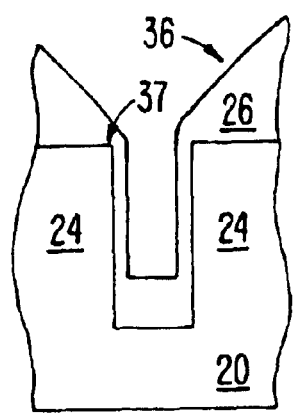
Figure 2D:
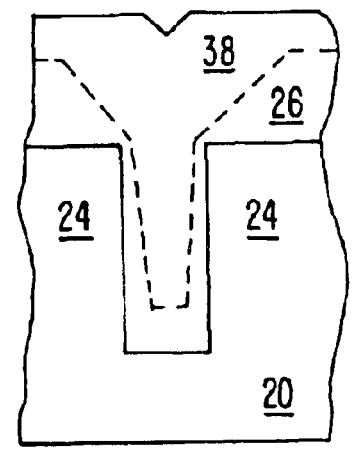

In some embodiments of the invention, the deposition of layer 26 is stopped just prior to or just after corners 34 contact each other and an etching process is performed to etch part of deposited first layer 26 (step 14). As shown in FIG. 2C, the etching process widens the entry to gap 22 thereby enabling a subsequent deposition step to completely fill the gap in a void-free manner. Depending on how aggressive the gapfill requirement is for a particular application, this dep/etch sequence of steps 12 and 14, along with passivation step 16 as discussed below, may be repeated multiple times before final deposition step 18.

In embodiments where deposition step 12 is stopped shortly after upper sections 34 of film 26 contact each other forming a void within gap 22, etch step 14 reopens the gap to expose the temporarily formed void while widening the entry to gap 22. In embodiments where deposition step 12 is stopped prior to sections 34 forming a void within gap 22, etch step 14 simply widens the gap entry. In some embodiments, etch step 14 has both a physical sputtering component and a chemical etch component thereby simultaneously etching layer 26 both anisotropically and isotropically. The profile of a film subjected to an etch step with such an anisotropic component includes an angled sidewall 36 as shown in FIG. 2C. Also, due to the isotropic etching effect, portions of the film sidewall below upper edges 34 are also etched isotropically thinning the film on the sidewall. In other embodiments, etch step 14 is primarily or solely a chemical isotropic etch.

In one embodiment the transition to the etching process is effected by stopping the flow of the silicon source gas and introducing a fluorine or other type of reactive etchant. One example of a suitable fluorine etchant is nitrogen trifluoride ($NF_3$). The invention is not limited to this particular etchant, however, and contemplates using any etchant known to etch silica glass. Also, in embodiments of the invention that deposit other types of material, any suitable etchant for the material deposited in step 10 may be employed.

A reactive etchant, such as $NF_3$, etches layer 26 isotropically. As discussed above, some embodiments of the invention introduce a sputtering element into the etchant gas and bias the substrate during step 14 to promote physical, anisotropic etching of the film. One embodiment flows oxygen into the chamber during the etch step. The inventors have found that the addition of oxygen to step 14 reduces the number of etch defects (silicon-rich areas) that may sometimes form. Other embodiments flow an inert gas such as helium or argon in addition to or instead of oxygen to sputter the film when a bias power is applied. It is desirable to strictly control etch step 14, and in particular the sputtering component of the etch step (if used), so that corners 37 of features 24 are not clipped off.

After layer 26 is etched to widen gap 22, embodiments of the invention passivate the surface of the etched film (step 16) prior to depositing a second portion of the gapfill material. As mentioned above in the Background of the Invention section, HDP-CVD dep/etch/dep processes that transition directly from a chemical etch step to a subsequent deposition step are prone to incorporate an undesirable amount of fluorine (or other halogen element depending on the reactive etchant used) and are prone to etch defects at the interface between the etched film and the newly deposited film. In one embodiment the surface of the film is passivated by exposing the substrate to a passivation gas that is selected to chemically react with surface of the film to remove fluorine (halogen) atoms that may be incorporated therein. Suitable passivating gases include molecular oxygen ($O_2$), ozone ($O_3$), nitrous oxide ($N_2O$) and molecular nitrogen ($N_2$) in combination with any of the preceding.

In another embodiment, the passivation step applies bias RF power to the passivation plasma in order to add a physical sputtering component to the passivation process. The combination of a chemical reaction and physical bombardment can be performed in a single step or in multiple steps.

After the surface of layer 22 is passivated, deposition of a second portion 38 of the gapfill layer is performed (step 18). In some embodiments layer 38 is deposited using substantially the same process as layer 26 in step 12. In other embodiments, however, deposition parameters for layer 38 are adjusted to optimize the deposition-to-etch ratio for the aspect ratio of the remaining portion of gap 22 to be filled. When the deposition process is completed, the plasma is extinguished and the substrate is transferred out of the chamber.

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

Figure 3A:
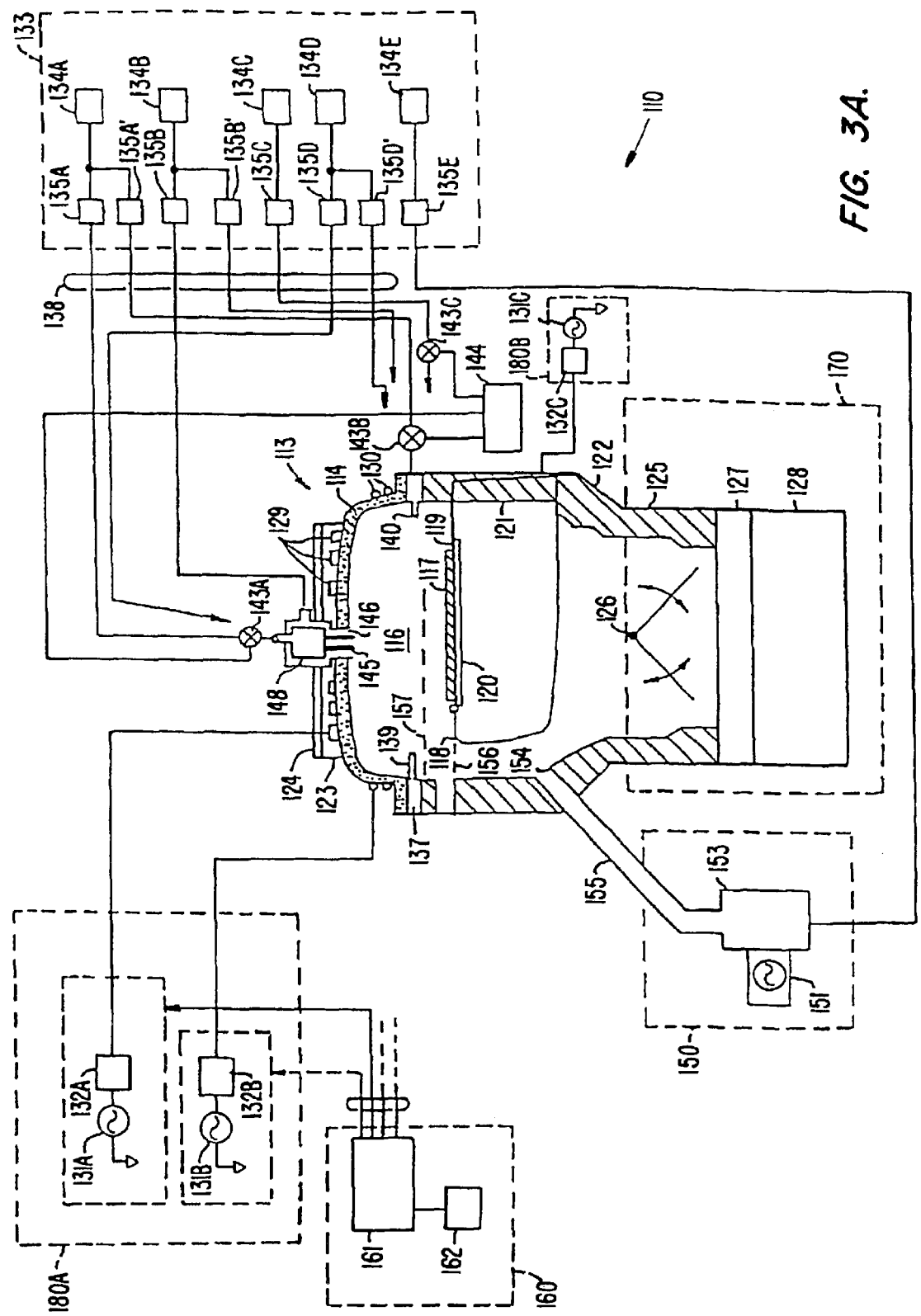
FIG. 3A is a simplified, cross-sectional view of an exemplary substrate processing system with which embodiments of the present invention may be used.

FIG. 3A illustrates one embodiment of a high density plasma chemical vapor deposition (HDP-CVD) system 110 in which a dielectric layer according to the present invention can be deposited. System 110 includes a chamber 113, a substrate support 118, a gas delivery system 133, a remote plasma cleaning system 150, a vacuum system 170, a source plasma system 180A, a bias plasma system 180B.

The upper portion of chamber 113 includes a dome 114, which is made of a ceramic dielectric material, such as aluminum oxide or aluminum nitride. Dome 114 defines an upper boundary of a plasma processing region 116. Plasma processing region 116 is bounded on the bottom by the upper surface of a substrate 117 and a substrate support 118, which is also made from an aluminum oxide or aluminum ceramic material.

A heater plate 123 and a cold plate 124 surmount, and are thermally coupled to, dome 114. Heater plate 123 and cold plate 124 allow control of the dome temperature to within about ±10° C. over a range of about 100° C. to 200° C. Generally, exposure to the plasma heats a substrate positioned on substrate support 118. Substrate support 118 includes inner and outer passages (not shown) that can deliver a heat transfer gas (sometimes referred to as a backside cooling gas) to the backside of the substrate.

The lower portion of chamber 113 includes a body member 122, which joins the chamber to the vacuum system. A base portion 121 of substrate support 118 is mounted on, and forms a continuous inner surface with, body member 122. Substrates are transferred into and out of chamber 113 by a robot blade (not shown) through an insertion/removal opening (not shown) in the side of chamber 113. Lift pins (not shown) are raised and then lowered under the control of a motor (also not shown) to move the substrate from the robot blade at an upper loading position 157 to a lower processing position 156 in which the substrate is placed on a substrate receiving portion 119 of substrate support 118. Substrate receiving portion 119 includes an electrostatic chuck 120 that can be used to secure the substrate to substrate support 118 during substrate processing.

Vacuum system 170 includes throttle body 125, which houses twin-blade throttle valve 126 and is attached to gate valve 127 and turbo-molecular pump 128. Gate valve 127 can isolate pump 128 from throttle body 125, and can also control chamber pressure by restricting the exhaust flow capacity when throttle valve 126 is fully open. The arrangement of the throttle valve, gate valve, and turbo-molecular pump allow accurate and stable control of chamber pressures as low as about 1 mTorr.

Source plasma system 180A is coupled to a top coil 129 and side coil 130, mounted on dome 114. A symmetrical ground shield (not shown) reduces electrical coupling between the coils. Top coil 129 is powered by top source RF (SRF) generator 131A, whereas side coil 130 is powered by side SRF generator 131B, allowing independent power levels and frequencies of operation for each coil. In a specific embodiment, the top source RF generator 131A provides up to 2,500 watts of RF power at nominally 2 MHz and the side source RF generator 131B provides up to 5,000 watts of RF power at nominally 2 MHz. The operating frequencies of the top and side RF generators may be offset from the nominal operating frequency (e.g. to 1.7–1.9 MHz and 1.9–2.1 MHz, respectively) to improve plasma-generation efficiency.

A bias plasma system 180B includes a bias RF (BRF) generator 131C and a bias matching network 132C. The bias plasma system 180B capacitively couples substrate portion 117 to body member 122, which act as complimentary electrodes. The bias plasma system 180B serves to enhance the transport of plasma species (e.g., ions) created by the source plasma system 180A to the surface of the substrate. In a specific embodiment, bias RF generator provides up to 5,000 watts of RF power at 13.56 MHz.

RF generators 131A and 131B include digitally controlled synthesizers and operate over a frequency range between about 1.8 to about 2.1 MHz. Each generator includes an RF control circuit (not shown) that measures reflected power from the chamber and coil back to the generator and adjusts the frequency of operation to obtain the lowest reflected power, as understood by a person of ordinary skill in the art. Matching networks 132A and 132B match the output impedance of generators 131A and 131B with their respective coils 129 and 130. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

A gas delivery system 133 provides gases from several sources 134(a) . . . 134(n) via gas delivery lines 138 (only some of which are shown). In the particular example illustrated below, gas sources 134(a) . . . 134(n) include separate sources for $SiH_4$, $O_2$, Ar and $NF_3$ as well as one or more sources for the extended cleaning process. As would be understood by a person of skill in the art, the actual sources used for sources 134(a) . . . 134(n) and the actual connection of delivery lines 138 to chamber 113 varies depending on the deposition and cleaning processes executed within chamber 113. Gas flow from each source 134(a) . . . 134(n) is controlled by one or more mass flow controllers (not shown) as is known to those of skill in the art.

Figure 3B:
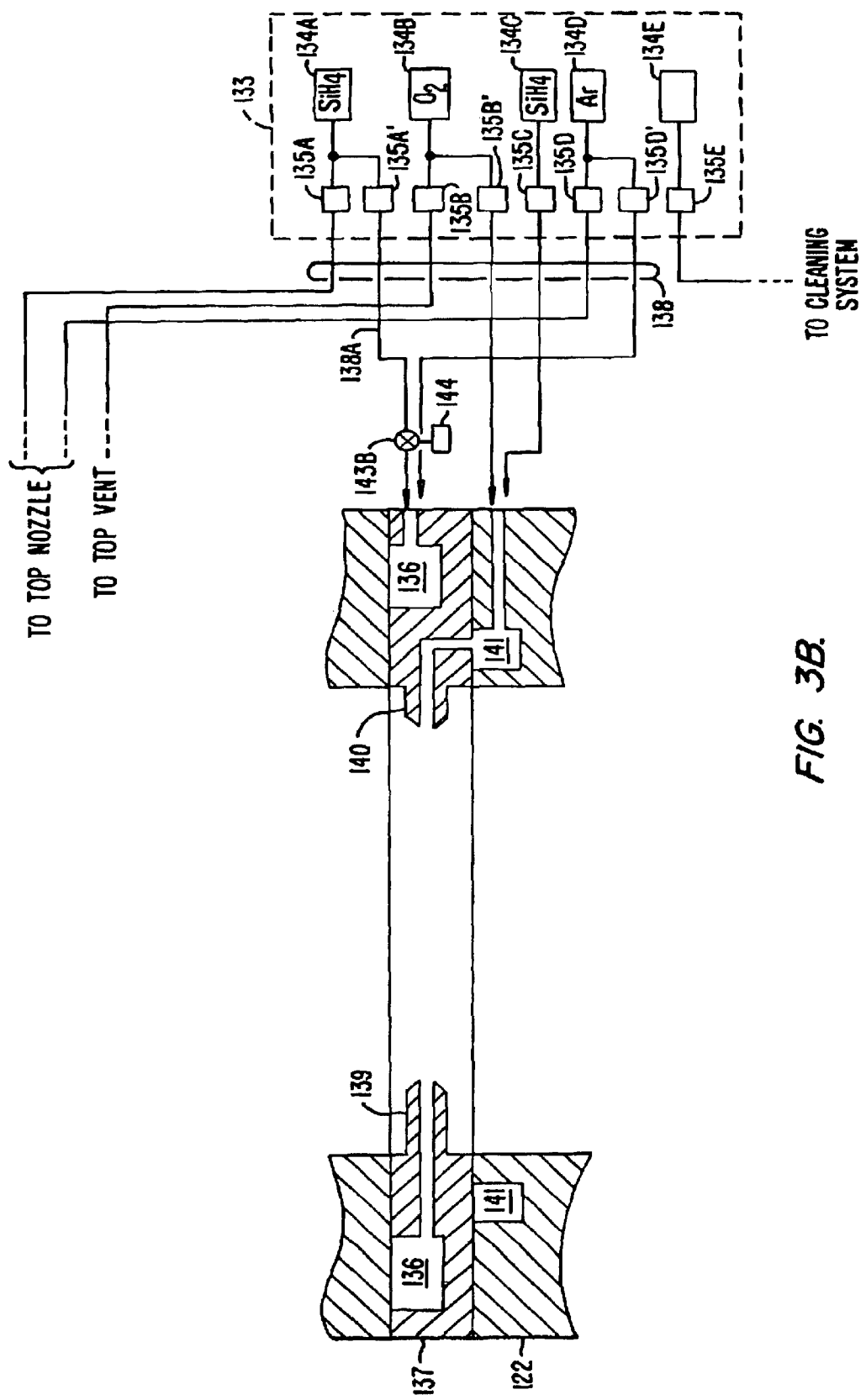
FIG. 3B is a simplified cross-sectional view of a gas ring that may be used in conjunction with the exemplary CVD processing chamber of FIG. 3A.

Gases are introduced into chamber 113 through a gas ring 137 and/or a top nozzle 145. FIG. 3B is a simplified, partial cross-sectional view of chamber 113 showing additional details of gas ring 137. In some embodiments, one or more gas sources provide gas to ring plenum 136 in gas ring 137 via gas delivery lines 138 (only some of which are shown). Gas ring 137 has a plurality of gas nozzles 139 (only one of which is shown for purposes of illustration) that provides a uniform flow of gas over the substrate. Nozzle length and nozzle angle may be changed to allow tailoring of the uniformity profile and gas utilization efficiency for a particular process within an individual chamber. In one specific embodiment, gas ring 137 has 124 gas nozzles 39 made from an aluminum oxide ceramic.

Gas ring 137 also has a plurality of gas nozzles 140 (only one of which is shown), which in a specific embodiment are co-planar with and shorter than source gas nozzles 139, and in one embodiment receive gas from body plenum 141. Gas nozzles 139 and 140 are not fluidly coupled in some embodiments where it is desirable to not mix gases (e.g., $SiH_4$ and $O_2$) introduced through gas ring 137 before injecting the gases into chamber 113. In other embodiments, gases may be mixed prior to injecting the gases into chamber 113 by providing apertures (not shown) between body plenum 141 and gas ring plenum 136. Additional valves, such as 143B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 143B, to isolate chamber 113 from a delivery line 138 and to vent delivery line 138 to vacuum foreline 144, for example. As shown in FIG. 3A, other similar valves, such as 143A and 143C, may be incorporated on other gas delivery lines. Such 3-way valves may be placed as close to chamber 113 and remote plasma source 150 as practical, to minimize the volume of the unvented gas delivery line (between the 3-way valve and the chamber). Additionally, two-way (on-off) valves (not shown) may be placed between a mass flow controller ("MFC") and the chamber or between a gas source and an MFC.

Referring again to FIG. 3A, chamber 113 also has top nozzle 145 and top vent 146. Top nozzle 145 and top vent 146 allow independent control of top and side flows of the gases, which improves film uniformity and allows fine adjustment of the film's deposition and doping parameters. Top vent 146 is an annular opening around top nozzle 145. In one embodiment, one source, e.g., $SiH_4$, supplies source gas nozzles 139 and top nozzle 145 through separate MFCs (not shown). Similarly, separate MFCs may be used to control the flow of oxygen to both top vent 146 and gas nozzles 140 from a single source of oxygen. The gases supplied to top nozzle 145 and top vent 146 may be kept separate prior to flowing the gases into chamber 113, or the gases may be mixed in top plenum 148 before they flow into chamber 113. In other embodiments, separate sources of the same gas may be used to supply various portions of the chamber.

A remote plasma cleaning system 150, such as a microwave plasma source or torodial plasma source, is provided to periodically clean deposition residues from chamber components in a dry cleaning operation. The cleaning system includes a remote plasma generator 151 that creates a plasma from one or more cleaning gas source in sources 134(a) . . . 134(n) (e.g., molecular fluorine, nitrogen trifluoride, other fluorocarbons or equivalents alone or in combination with another gas such as Argon) in reactor cavity 153. The reactive species resulting from this plasma are conveyed to chamber 113 through cleaning gas feed port 154 via applicator tube 155. The materials used to contain the cleaning plasma (e.g., cavity 153 and applicator tube 155) must be resistant to attack by the plasma. The distance between reactor cavity 153 and feed port 154 should be kept as short as practical, since the concentration of desirable plasma species may decline with distance from reactor cavity 153. Generating the cleaning plasma in a remote cavity does not subject chamber components to the temperature, radiation, or bombardment of the glow discharge that may be present in a plasma formed in situ. Consequently, relatively sensitive components, such as electrostatic chuck 120, do not need to be covered with a dummy wafer or otherwise protected, as may be required with an in situ plasma cleaning process.

System controller 160 controls the operation of system 110. Controller 160 may include, for example, a memory 162, such as a hard disk drive and/or a floppy disk drive and a card rack coupled to a processor 161. The card rack may contain a single-board computer (SBC), analog and digital input/output boards, interface boards and stepper motor controller boards. System controller 160 operates under the control of a computer program stored on the hard disk drive or through other computer programs, such as programs stored on a removable disk. The computer program dictates, for example, the timing, mixture of gases, RF power levels and other parameters of a particular process.

Figure 4:
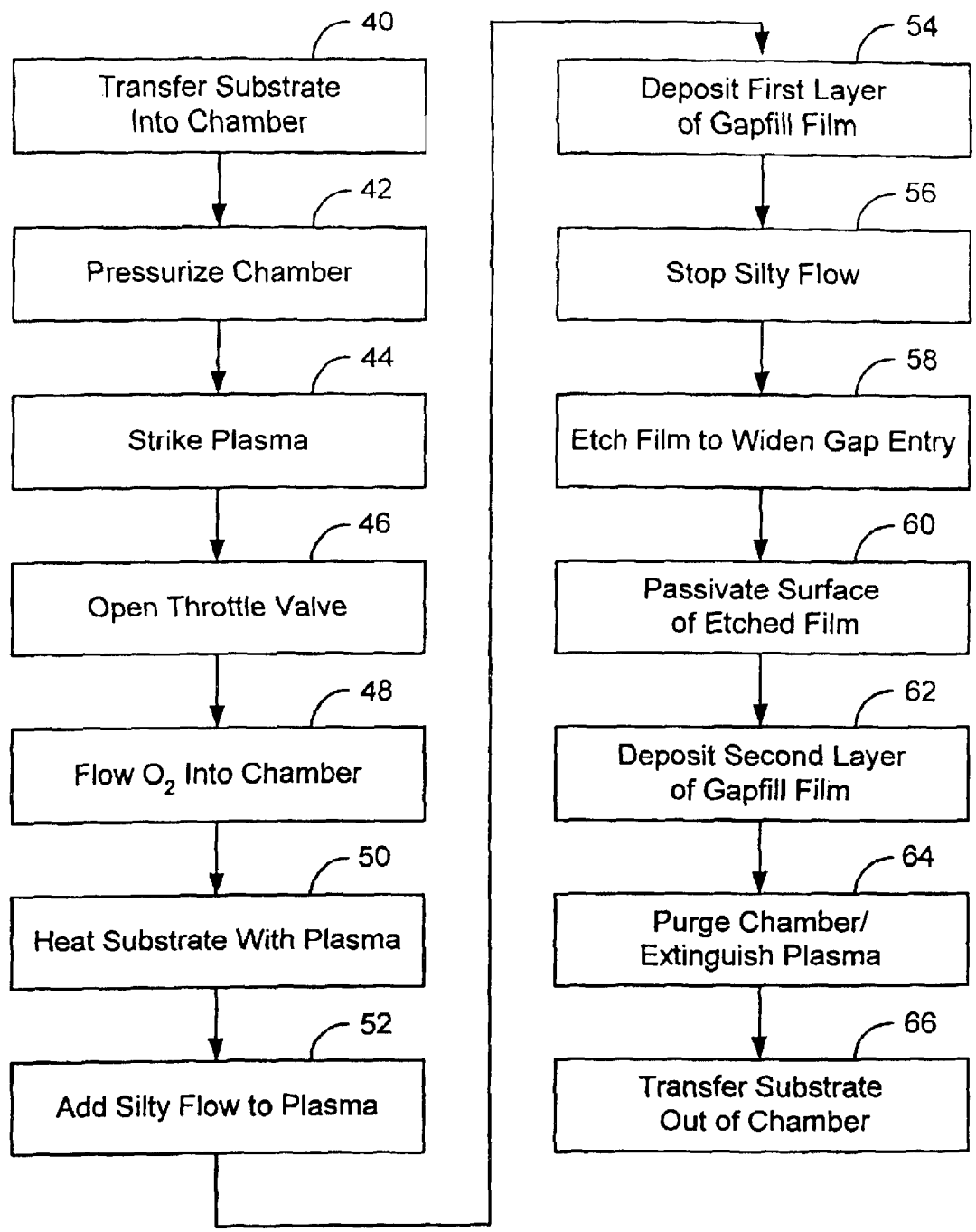
FIG. 4 is a flowchart depicting the steps associated with another embodiment of the present invention.

FIG. 4 is a flowchart depicting the steps associated with deposition of a silica glass film according to an embodiment of the present invention implemented in the exemplary chamber described with respect to FIGS. 3A–3B. The process depicted in FIG. 4 begins by transferring a substrate into substrate processing chamber 113 (step 40). Next, argon is flowed into the chamber with the throttle valve 126 in a closed position in order to pressurize the chamber in preparation for striking a plasma (step 42). Once the pressure has reached a sufficient level, a plasma is formed by applying RF power to top coil 129 (step 44), the throttle valve is partially opened and RF power is applied to side coil 130 (step 46).

A flow of oxygen gas is then added to the argon flow and the throttle valve is fully opened so that chamber pressure is set entirely by the rate at which gases are introduced into the chamber (step 48). Next, the plasma is maintained with flows of oxygen and argon in order to heat the substrate prior to initiating deposition of the silica glass layer (step 50). In some embodiments, heating step 50 heats the substrate to a temperature of at least 400° C. and, in some other embodiments, above 500° C. Typically heating step 50 uses source RF power only (no bias RF power) in order to ensure the underlying substrate features are not sputtered. Also, in some embodiments the substrate is not chucked to substrate support 113 during heating step 50.

Once the substrate reaches a sufficient temperature, the substrate is chucked to substrate support 118 and a flow of silane is added to the oxygen and argon flows to initiate the silica glass deposition process (step 52). The argon flow is then stopped, the flow rates of the silane and oxygen are increased to levels optimized for gapfill capabilities during the deposition of the first portion 26 of the silica glass film and bias power is applied to the pedestal (step 54). Some embodiments of the invention exclude a flow of argon from the deposition gas during step 52 in order to minimize sidewall redeposition that results in closing of the gap as discussed above with respect to FIG. 2B. Other embodiments of the invention add a flow of hydrogen or helium to the process gas in order to further improve gapfill capabilities as described in U.S. patent application Ser. No. 09/854,406, filed May 11, 2001, entitled "Hydrogen Assisted Undoped Silicon Oxide Deposition Process For HDP-CVD," having Zhengquan Tan et al. listed as coinventors; and U.S. patent application Ser. No. 10/137,132, filed Apr. 30, 2002, entitled "Method for High Aspect Ratio HDP CVD Gapfill," having Zhong Qiang Hua et al. listed as coinventors and are incorporated herein by reference in their entirety.

Deposition of first portion 26 of the silica glass layer is stopped after a predetermined time by stopping the flow of the silane source and switching the bias power OFF (step 56). Oxygen flow is increased slightly in step 56 in order to compensate for the stoppage of the silane source and prevent the plasma from being extinguished. In some embodiments the substrate temperature reaches levels above 550° C. during the deposition of the silica glass layer. Accordingly, some embodiments maintain an unbiased, oxygen only plasma during step 56 for between 5–20 seconds in order to allow the temperature of the substrate to cool to a temperature less than 550° C. and preferably between 350 and 500° C. Allowing the substrate to cool between deposition and etch steps enables layer 26 to be etched in a more controllable fashion.

Next, a flow of $NF_3$ is introduced along with the oxygen and the RF power levels are reduced to values appropriate for the etch process (step 58). As described above with respect to FIG. 1, etch step 58 widens the entry to gap 22 thereby enabling the gap to be filled in one or more subsequent deposition steps. The inventors have found that including both a reactive etchant and oxygen in the etchant gas in step 58 provides a number of advantages including reducing the etch rate of the process to a more controllable rate, reducing the number of particles generated during the etch process and subsequent deposition process and also improving the uniformity of the etch process so that fewer silicon-rich pockets (etch defects) are formed on the surface of the etched substrate. Some embodiments of the invention introduce a hydrogen source, such as $H_2$, into the etchant gas in step 58 in order to improve the etch selectivity of the process to silicon nitride and/or silicon.

The embodiment shown in FIG. 4 transitions from etch step 58 to a subsequent deposition step by increasing the RF power levels applied to top and side coils 129 and 130, respectively, and reducing the flow rates of $NF_3$ and oxygen. Then, the flow of $NF_3$ is stopped altogether and RF bias power is applied to bombard the surface of the substrate with an oxygen-only plasma (step 60). As described above, the inventors have devised passivation step 60 in order to reduce the amount of fluorine incorporated into the gapfill layer at the interface of the layers formed before and after the etch step as well as to reduce the number of silicon-rich pockets formed.

After the passivation step is completed, RF power levels for the top and side coils as well are increased, the bias power level is increased, the flow rate of oxygen is reduced and silane is introduced into the chamber to deposit top portion 38 of the silica glass layer over the substrate (step 62). After top portion 38 is deposited, the flow of silane is stopped, the chamber is purged, the plasma is extinguished and the substrate is dechucked (step 64) prior to transferring the substrate out of the chamber altogether (step 66).

Depending on the height of gap to be filled as well as the width of the gap and its profile (e.g., whether or not it has a reentrant profile), additional deposition, etch and passivation sequences similar to the step 54, 58 and 60 sequence may be repeated one or more times as necessary prior to depositing the top portion 38 of the silica glass layer in step 62.

Table 1 below lists the process parameters according to an embodiment of the present invention implemented in the Ultima HDP-CVD chamber manufactured for Applied Materials and outfitted for 200 mm substrates. The gas flow rates and other parameters set forth in Table 1 below are optimized for a deposition process run in the Ultima chamber. A person of ordinary skill in the art will recognize that these rates and parameters are in part chamber specific and will vary if chambers of other design and/or volume are employed.

Figure 5A:
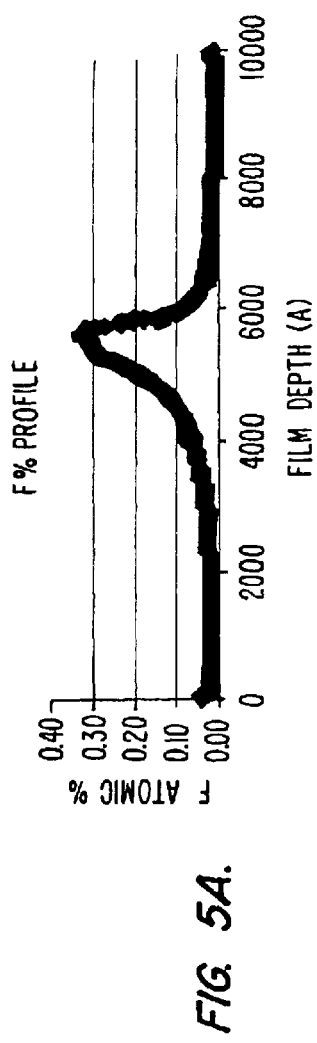
FIGS. 5A and 5B are graphs showing the fluorine concentration of USG films deposited according to HDP-CVD dep/etch/dep processing with and without the benefits of the present invention.

Tests the inventors performed depositing undoped silica glass films using in situ HDP-CVD dep/etch/dep techniques without employing the techniques of the present invention exhibited a fluorine concentration of about 0.30 atomic percent at the interface between the first and second layers of the film. These tests measured fluorine concentration using secondary ion mass spectrometry (SIMS) techniques as is known to those of skill in the art. A graph showing the fluorine concentration of a USG film in which an $NF_3$ etch step was employed between two 5000 Å layers is shown in FIG. 5A. As shown in FIG. 5A, the deposited USG film includes a significantly higher fluorine concentration near the interface of the two USG layers than throughout the bulk of the USG film.

Figure 5B:
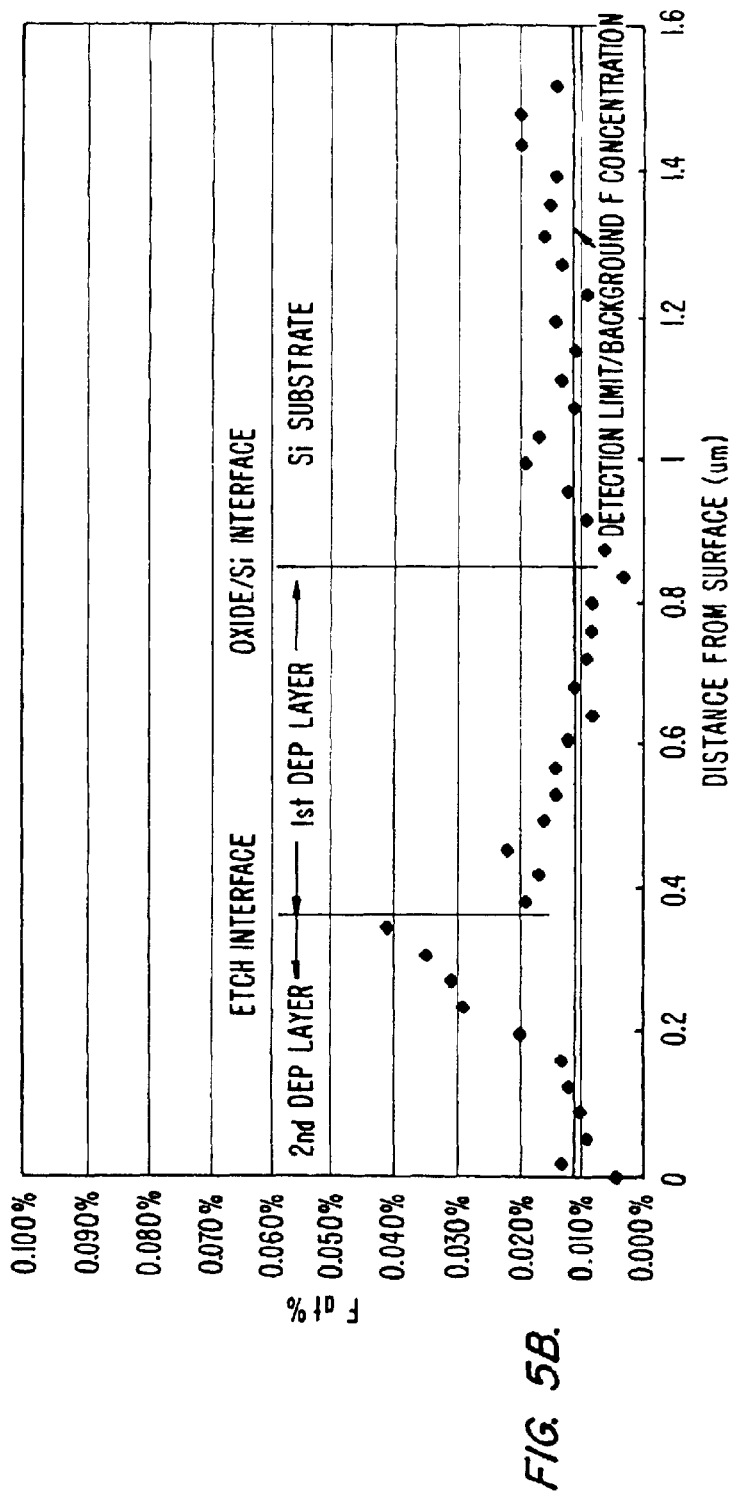

In contrast, tests the inventors performed depositing undoped silica glass layers according to the techniques of the invention exhibited an order of magnitude less fluorine at the film interface. The results of one of these tests in which an $NF_3$ etch step was employed between a first 4500 Å layer and a subsequent 3800 Å layer is shown in FIG. 5B. The measurements in FIG. 5B were performed using nuclear reaction analysis (NRA) techniques as is known to those of skill in the art. As evident from FIG. 5B, a peak concentration of about 0.04 atomic percent fluorine exists at the interface of the two layers. Additionally, the number of etch defects in the film were significantly reduced. Accordingly, as demonstrated by FIG. 5B, some embodiments of the invention are able to deposit a USG film having a fluorine concentration of less than 0.10 atomic percent throughout the entire bulk layer of the USG film using a dep/etch/dep technique.

Having fully described several embodiments of the present invention, many other equivalents or alternative embodiments of the present invention will be apparent to those skilled in the art. For example, while the invention described with respect to an undoped silicate glass layer, the invention can also be used to improve the gapfill capabilities of phosphosilicate glass (PSG), boron-doped silicate glass (BSG), boron phosphosilicate glass (BPGS) layers and fluorine-doped silicon glass (FSG) as well as other types of materials. For such films, a dopant gas such as $PH_3$ and/or $B_2H_6$ is added to the process gas in one or more of the film deposition steps. Also, in other embodiments, an oxygen source such as $N_2O$ or $CO_2$ can be used instead of $O_2$ and a silicon source other than monosilane may be used. Examples of suitable silicon sources include other silane family members such as, $Si_2H_6$, $Si_3H_8$, etc.; TEOS and $SiF_4$ among others. As such, the above description is illustrative

TABLE 1

EXEMPLARY RANGES FOR PROCESS PARAMETERS

| Parameter | Dep 1 (Step 54) | Etch (Step 58) | Passivation (Step 60) | Dep 2 (Step 62) |
|---|---|---|---|---|
| Top RF Power (1.8 MHz) | 3000–5100 W | 600–3000 W | 1000–4000 W | 3000–5100 W |
| Side RF Power (2.1 MHz) | 3000–4800 W | 600–3000 W | 1000–4000 W | 3000–4800 W |
| Bias RF Power (13.56 MHz) | 600–4000 W | 0–1000 W | 0–1500 W | 600–4000 W |
| $SiH_4$ Flow | 20–160 sccm | — | — | 20–160 sccm |
| $O_2$ Flow | (1.4–2.2) × $SiH_4$ Flow | 0–400 sccm | 100–400 sccm | (1.4–2.2) × $SiH_4$ flow |
| $NF_3$ Flow | — | 200–800 sccm | — | — |
| Pressure | 1.5–6.0 mTorr | 5–50 mTorr | 2.0–8.0 mTorr | 1.5–6.0 mTorr |

What is claimed is:

1. A method of depositing a film on a substrate disposed in a substrate processing chamber, the method comprising:
   depositing a first portion of the film by forming a high density plasma from a first gaseous mixture flown into the process chamber;
   thereafter, etching part of the deposited first portion of the film by flowing a halogen etchant into the processing chamber;
   thereafter, passivating the surface of the etched film by flowing a passivation gas into the processing chamber;
   thereafter, depositing a second portion of the film over the first portion by forming a high density plasma from a second gaseous mixture flown into the process chamber.

2. The method of claim 1 wherein the halogen etchant is a fluorine-containing gas.

3. The method of claim 1 wherein the first and second gaseous mixtures are silica glass deposition gases.

4. The method of claim 3 wherein the first and second gaseous mixtures each comprise silane and oxygen.

5. The method of claim 1 wherein bias power is applied while the first gaseous mixture is flowed into the chamber during deposition of the first portion of the film.

6. The method of claim 5 wherein the bias power is switched off prior to flowing the halogen etchant into the chamber.

7. The method of claim 1 wherein the passivation gas comprises oxygen.

8. The method of claim 1 wherein the passivating step comprises exposing the surface of the etched film to a high density plasma consisting of an oxygen source with or without an inert gas.

9. The method of claim 1 wherein bias power is applied to the chamber during the passivating step.

10. A method of depositing a silica glass film on a substrate disposed in a substrate processing chamber, the method comprising, in order:
    flowing a first process gas comprising silane and oxygen into the processing chamber and forming a high density plasma from the first process gas to deposit a first portion of the silica glass film over the substrate;
    stopping deposition of the silica glass film and flowing a fluorine etchant into the process chamber to etch part of the first portion of the silica glass film;
    flowing a passivation gas comprising oxygen into the processing chamber; and
    flowing a second process gas comprising silane and oxygen into the processing chamber to deposit a second portion of the silica glass film over the first portion;
    wherein the high density plasma is continuously maintained during each of the above steps.

11. The method of claim 10 wherein the passivation gas consists of an oxygen source with our without an inert gas.

12. The method of claim 11 wherein bias power is applied to the chamber while the passivating is flown into the chamber.

13. The method of claim 10 wherein bias power is (i) applied while the first process gas is flowed into the chamber during deposition of the first portion of the silica glass film and (ii) switched off prior to flowing the fluorine etchant gas into the chamber to etch part of the first portion of the silica glass film.

14. The method of claim 13 wherein bias power is again applied while the second process gas is flowed into the chamber during deposition of the second portion of the silica glass film.

15. The method of claim 14 wherein an oxygen-containing source is flowed into the chamber along with the fluorine etchant when the first portion of the silica glass film is etched.

16. A method of depositing a silica glass film on a substrate disposed in a substrate processing chamber, the method comprising:
    forming a high density plasma within the substrate processing chamber to heat the substrate to a temperature of at least 400° C. prior to depositing the silica glass film on the substrate;
    maintaining the high density plasma while (i) flowing a first process gas comprising a silicon source and an oxygen source into the processing chamber to deposit a first portion of the silica glass film over the substrate, (ii) flowing a fluorine-containing etchant gas into the process chamber to etch part of the first portion of the silica glass film; (iii) flowing a passivation gas comprising oxygen into the processing chamber and (iv) flowing a second process gas comprising silane and oxygen into the processing chamber to deposit a second portion of the silica glass film over the first portion;
    wherein RF bias power is applied to the chamber during deposition of the first portion of the film, stopped prior to etching the part of the first portion of the film and then again applied prior to deposition of the second portion of the film.

17. The method of claim 16 wherein the passivation gas consists of an oxygen source with our without an inert gas and a second step, after the first step, in which the flow of the oxygen source is maintained while the flow of the fluorine source is stopped.

18. The method of claim 17 wherein bias power is applied to the chamber during the passivating step.

19. A method of depositing a silica glass film on a substrate disposed in a substrate processing chamber, the method comprising:
    flowing an inert gas into the substrate processing chamber;
    forming a high density plasma within the substrate processing chamber from the inert gas;
    adding a flow of oxygen to the plasma and heating the substrate to a temperature of at least 400° C. prior to depositing the silica glass film on the substrate;
    adding a flow of silane to the plasma to deposit a first portion of the silica glass film over the substrate, wherein RE bias power is applied to the chamber during deposition of the first portion of the film;
    stopping the flow of silane and adding a flow of a fluorine-containing etchant to the plasma to etch part of the first portion of the silica glass film, wherein RF bias power is stopped prior to etching the part of the first portion of the film;
    stopping the flow of the fluorine-containing etchant and exposing the surface of the substrate to a oxygen plasma for between 5 and 20 seconds, wherein RE bias power is applied during passivation of the upper surface;
    adding a flow of silane to the plasma to deposit a second portion of the silica glass film over the first portion, wherein RE bias power is applied during deposition of the second portion of the film.

20. A method of filling a gap formed between adjacent raised surfaces on a substrate with a silica glass film, the method comprising:

transferring the substrate into a high density plasma CVD substrate processing chamber;

partially filling the gap by depositing a first portion of the silica glass film over the substrate by flowing a first process gas comprising silicon and oxygen into the processing chamber and forming a high density plasma from the first process gas;

etching the first portion of the silica glass film by flowing an etchant gas comprising a fluorine etchant into the process chamber and forming a high density plasma from the etchant gas;

thereafter, exposing the first portion of the silica glass film to a high density plasma formed from a passivation gas comprising oxygen introduced into the processing chamber; and thereafter, filling the gap by depositing a second portion of the silica glass film over the first portion by flowing a second process gas comprising silicon and oxygen into the processing chamber and forming a high density plasma from the second process gas.

21. The method of claim 20 wherein the passivation gas consists of oxygen with or without an inert gas.

22. The method of claim 21 wherein the first and second process gases each comprise silane and molecular oxygen.

23. The method of claim 22 wherein the etchant gas comprises nitrogen trifluoride.

* * * * *